(12) United States Patent
Leussler

(10) Patent No.: US 6,825,661 B2
(45) Date of Patent: Nov. 30, 2004

(54) MAGNETIC RESONANCE IMAGING APPARATUS PROVIDED WITH AN OPEN MAGNET SYSTEM

(75) Inventor: Christoph Guenther Leussler, Hamburg (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 7 days.

(21) Appl. No.: 10/078,957

(22) Filed: Feb. 19, 2002

(65) Prior Publication Data

US 2003/0001572 A1 Jan. 2, 2003

(30) Foreign Application Priority Data

Feb. 20, 2001 (DE) .......................................... 101 07 867

(51) Int. Cl.⁷ ................................................ G01V 3/00
(52) U.S. Cl. ..................................... 324/318; 324/319
(58) Field of Search .............................. 324/318, 322, 324/319, 300; 600/410; 128/653.5

(56) References Cited

U.S. PATENT DOCUMENTS

| | | | |
|---|---|---|---|
| 756,989 A | 4/1904 | Suhr | 116/174 |
| 1,236,417 A | 8/1917 | Finn | 116/174 |
| 1,306,915 A | 6/1919 | Klamroth | 116/174 |
| 1,678,529 A | 7/1928 | Peters | 116/174 |
| 2,368,783 A | 2/1945 | Schillinger | 116/174 |
| 2,672,118 A | 3/1954 | Martin | 116/174 |
| 2,711,712 A | 6/1955 | Reed, Jr. | 116/174 |
| 2,799,240 A | 7/1957 | Andrews | 116/174 |
| 3,706,297 A | 12/1972 | Voorhees | 116/174 |
| 4,452,167 A | 6/1984 | Burroughs | 116/173 |
| 5,279,250 A | 1/1994 | Palermo et al. | 116/174 |
| 5,363,607 A | 11/1994 | Turturro | 52/40 |
| 5,467,017 A * | 11/1995 | Duerr et al. | 324/318 |
| 5,568,784 A | 10/1996 | Willis et al. | 116/173 |
| 5,809,930 A | 9/1998 | Brooks | 116/174 |
| 5,975,009 A | 11/1999 | Nihra et al. | 116/173 |
| 6,317,618 B1 * | 11/2001 | Livni et al. | 600/410 |
| 6,590,391 B1 * | 7/2003 | Shudo et al. | 324/318 |

FOREIGN PATENT DOCUMENTS

| | | | |
|---|---|---|---|
| EP | 0 359 374 | * | 8/1988 |
| WO | WO 01/53847 A1 | * | 1/2001 |

* cited by examiner

Primary Examiner—Brij B. Shrivastav
(74) Attorney, Agent, or Firm—John Vodopia

(57) ABSTRACT

The invention relates to a magnetic resonance imaging apparatus (MRI apparatus) which is provided with an open magnet system and in which there are generated a basic magnetic field (vertical field) which perpendicularly traverses an object to be examined and also an RF field, which MRI apparatus is characterized notably in that coupling effects between a dipole structure (11, 12, 13), formed by the magnet system (10), and an RF conductor structure (20, 21, 22) are eliminated at least to a high degree by shifting or detuning a self-resonant frequency of the dipole structure relative to the MR frequency or by suppressing a self-resonant frequency of the dipole structure.

18 Claims, 6 Drawing Sheets

MAGNETIC RESONANCE IMAGING APPARATUS PROVIDED WITH AN OPEN MAGNET SYSTEM

The invention relates to a magnetic resonance imaging apparatus (MR apparatus) which is provided with an open magnet system. Magnet systems of this kind are essentially C-shaped and comprise an upper section and a lower section which both extend in the horizontal direction and are interconnected by way of a vertical column. An object to be examined (a patient) is arranged between the horizontal sections. Because the object to be examined is readily accessible from all sides, such systems are referred to as open magnet systems (as opposed to systems having a tubular examination zone); one or more further vertical columns may also be provided, for example, in order to enhance the mechanical stability of the magnet system.

Pole plates for generating a basic magnetic field ($B_0$-field) as well as gradient magnetic fields are provided on the horizontal sections of such magnet systems. The basic magnetic field extends through the patient essentially in a direction perpendicular to the longitudinal axis of the patient (that is, generally in the vertical direction).

Flat, or at least flattish, RF conductor structures (flat resonators) in the form of RF transmitter coils or RF receiver coils are used to generate an RF field ($B_1$-field) as well as to detect MR relaxation processes, said coils being provided on the pole plates. Furthermore, RF receiving coils can also be arranged around a region to be examined.

The MR frequency is dependent on the strength of the basic magnetic field. For the field strength of approximately 0.2 Tesla as customarily used nowadays, an MR frequency of approximately 8.2 MHz is obtained. In order to enhance the image quality, the aim is generally to increase this field strength to a range of up to approximately 1 Tesla; this value would give rise to an MR frequency of approximately 42.3 MHz. However, such a frequency would give rise to numerous problems during operation of an MR imaging apparatus of the known kind.

A first problem is due to the fact that the magnet system itself constitutes an electrical resonator, because the C shape has the effect of a folded dipole. The self-resonant frequency of a superconducting C-shaped magnet system is in the range of from 40 to 50 MHz in the case of customary dimensions of an MR apparatus which is intended for the examination of humans, so that it is of the same order of magnitude as the MR frequency at a field strength of the basic magnetic field which amounts to 1 Tesla (42.3 MHz). Consequently, electromagnetic energy can move from a corresponding RF transmitter coil into the magnet system and excite resonances therein which may give rise to strong electrical and magnetic fields on the enclosure of the magnet, and notably on the free ends of the C shape (so-called hot spots). Furthermore, the RF receiving coils could become coupled to the magnet system, so that the signal-to-noise ratio deteriorates and imaging is affected.

An additional problem consists in that, generally speaking, the RF transmitter coils are arranged directly on the pole plates where a current maximum of the dipole structure formed by the magnet system occurs, so that the RF transmitter coils are particularly sensitive to the resonant dipole structure and hence a comparatively strong coupling occurs and also strong influencing of the RF transmitter coils. Consequently, quadrature coil systems present in the magnet system may thus even be prevented from generating a circularly polarized RF field, because the coupling to the dipole field eliminates the orthogonality.

A further problem consists in that, as opposed to imaging apparatus provided with a tubular examination space, the RF conductor structures in open MR systems radiate electromagnetic energy essentially freely to the surrounding space. The space in which an MR imaging apparatus is installed, therefore, must always be shielded so as to prevent the electromagnetic radiation from interfering with the surroundings. Such a space (RF cage), however, at the same time constitutes a cavity resonator which is capable of absorbing energy. The fundamental mode of such a space, typically having the dimensions of 5 by 5 by 3 meters, amounts to approximately 42 MHz, so that space resonance can be excited and couplings between the RF structures and the space, being tuned to the (essentially the same) RF frequency, are unavoidable.

Thus, increasing the field strength of the basic magnetic field would give rise to numerous problems in the known MR imaging apparatus.

Therefore, it is an object of the invention to provide an MR imaging apparatus of the kind set forth which can operate with significantly higher field strengths (that is, field strengths of up to 1 Tesla or more) of the basic magnetic field, that is, essentially without interference and with a higher image quality.

This object is achieved by means of a magnetic resonance imaging system which is provided with an open magnet system as disclosed in claim 1 and is characterized in that coupling effects between a dipole structure formed by the magnet system and an RF conductor structure tuned to an MR frequency are eliminated at least to a high degree by shifting or detuning a self-resonant frequency of the dipole structure relative to the MR frequency.

In conformity with a further solution as disclosed in claim 2, such coupling effects are eliminated at least to a high degree by suppression of a self-resonant frequency of the dipole structure.

If necessary, the above two steps can also be combined.

The dependent claims relate to further advantageous elaborations of the invention.

The claims 3 to 6 disclose advantageous types of shifting or detuning of the self-resonant frequency of the dipole structure by changing the electrical length thereof.

The claims 7 to 10 relate to the suppression of the self-resonant frequency of the dipole structure by way of a standing wave barrier or impedance trap and its advantageous embodiments.

In order to optimize its effect in respect of avoiding couplings between the magnet system and the RF conductor structure, the impedance trap is preferably tuned to the MR frequency in conformity with claim 8.

The embodiments disclosed in the claims 9 and 10 are advantageous in particular when the geometrical length of the impedance trap deviates from the electrical length actually required.

The embodiment disclosed in claim 11 prevents emitted electromagnetic radiation from interfering with the surroundings of an RF cage and also prevents the formation of standing waves within the RF cage.

Further details, characteristics and advantages of the invention will become apparent from the following description of preferred embodiments which is given with reference to the drawing. Therein:

Figure 1:
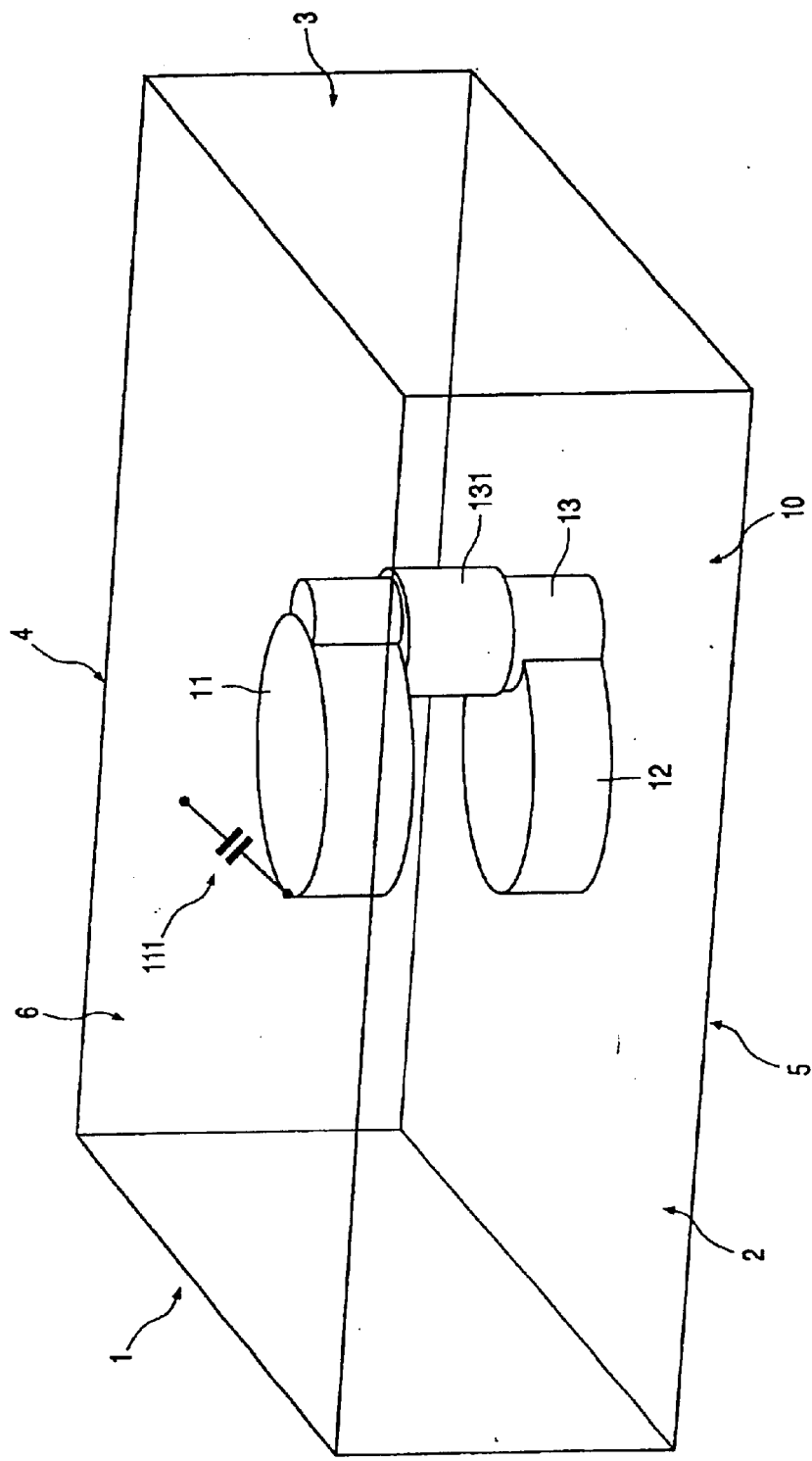
FIG. 1 is a diagrammatic three-dimensional representation of an MR imaging apparatus in an examination room.

FIG. 1 shows a room with four walls 1 to 4, a floor 5 and a ceiling 6. For the reasons already set forth, the room is shielded on all sides and hence constitutes an RF cage so that the electromagnetic energy generated inside the room cannot cause interference outside the room.

In the room there is installed an MR imaging apparatus which is represented only by the magnet system 10. The magnet system is shaped as a letter C which comprises an upper horizontal section 11, a lower horizontal section 12 as well as a vertical column 13 which interconnects said sections. The upper section 11 and the lower section 12, wherebetween the examination zone for a patient is situated, accommodates in a customary fashion magnets for generating a vertical basic magnetic field of a field strength of up to approximately 1 Tesla as well as for generating gradient magnetic fields.

At its free end which is remote from the column 13, the upper section 11 is RF coupled, via an essentially capacitive impedance 111, to the shielding of the ceiling 6 of the room, whereas the lower section 12 rests on the floor 5 of the room. The lower section need not necessarily be insulated relative to the floor, because the magnet system is in any case connected to ground potential via various connections such as, for example, supply leads for the gradient coils etc.

As has already been explained, the C-shaped magnet system 10 has the electrical properties of a folded dipole structure. Because of the connection of the upper section 11 to the RF cage, the dipole is electrically extended so that its resonant frequency is reduced accordingly and is spaced apart from the MR frequency which amounts to approximately 42.3 MHz in the case of a strength of the basic magnetic field of approximately 1 Tesla. Consequently, coupling effects between the magnet system and the RF conductor structures are reduced or eliminated at the same time.

If necessary, a short-circuit connection may be chosen for the connection instead of the capacitive impedance.

Furthermore, the column 13 of the magnet system 10 is also provided with a standing wave barrier (or impedance trap or bezooka balun) 131 in the form of an additional, electrically conductive shield which is arranged around the column 13 as a sheath and has an electrical length of $\lambda/4$ (the effective electrical length can be adapted to a deviating geometrical length by means of capacitors and/or dielectric materials. A vertical end of the shield is then short-circuited to the inner magnet structure whereas the other end is open. Consequently, the impedance trap acts as an open $\lambda/4$ lead and hence constitutes a high-ohmic barrier for RF currents of the wavelength $\lambda$, so that the electrical resonance of the dipole structure is suppressed at the wavelength $\lambda$ which is preferably the MR frequency.

Depending on the strength of the basic magnetic field as well as the resultant degree of convergence of the MR frequency and the self-resonant frequency of the dipole structure, imposed by the dimensions of the magnet system, one or both of the above two steps can be chosen so as to achieve adequate decoupling between the RF conductor structures and the magnet system. Moreover, the lower section 12 of the magnet system 10 can also be capacitively coupled to the shielding provided in the floor 5, resulting in a further increase of the length of the dipole.

Figure 2:
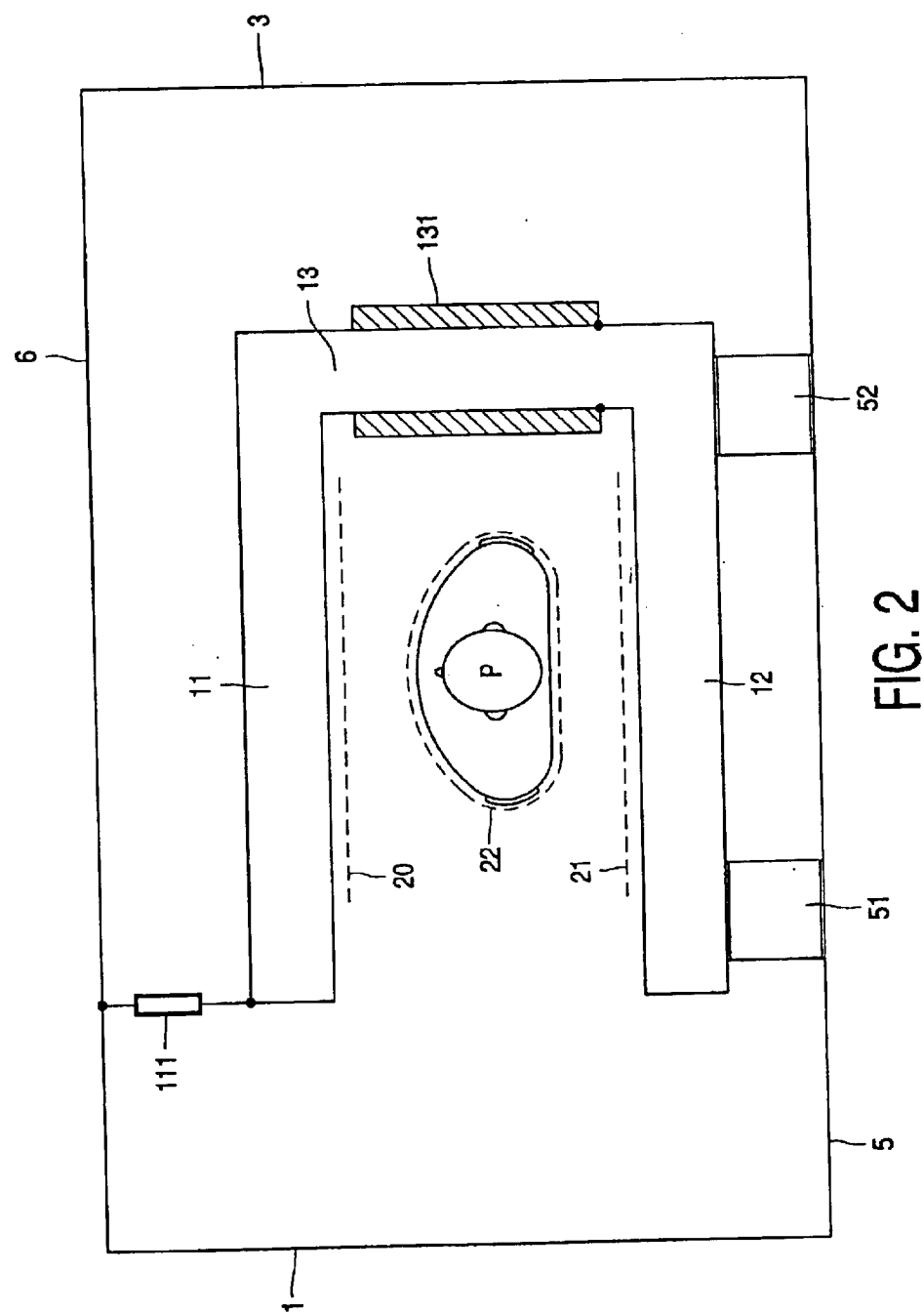
FIG. 2 is a side elevation of a first embodiment of the magnet system.

FIG. 2 is a side elevation of the first embodiment. Parts which correspond to those in FIG. 1 are denoted by the same reference numerals. The magnet system rests on feet 51, 52, that is, preferably in an electrically insulated manner, and comprises the horizontal upper section 11, the horizontal lower section 12 and the column 13 which links said sections. The impedance trap 131 is shown in a cut-away view and its lower end is connected to the magnet structure of the column 13 whereas its upper end is open. The free end of the upper section 11 is coupled, via the essentially capacitive impedance 111 (or a short-circuit connection), to the shielding of the ceiling 6 of the room. Also shown are the RF conductor structures which are in this case formed by a first RF transmitter coil 20 below the upper section 11, by a second RF transmitter coil 21 above the lower section 12, as well as by an RF receiver coil 22 which is arranged around a patient P.

When the first RF coil 20 and the second RF coil 21 are connected to one another by way of a common supply cable, these elements may constitute a second dipole structure in which a further dipole resonance is built up. In order to suppress this resonance, the common supply cable is also enclosed by way of an impedance trap. Alternatively, the supply cable can be conducted through the impedance trap 131 which encloses the column 13, so that it prevents the occurrence of resonance of the magnet structure 11, 12, 13 as well as of the RF transmitter coils 20, 21.

Figure 3:
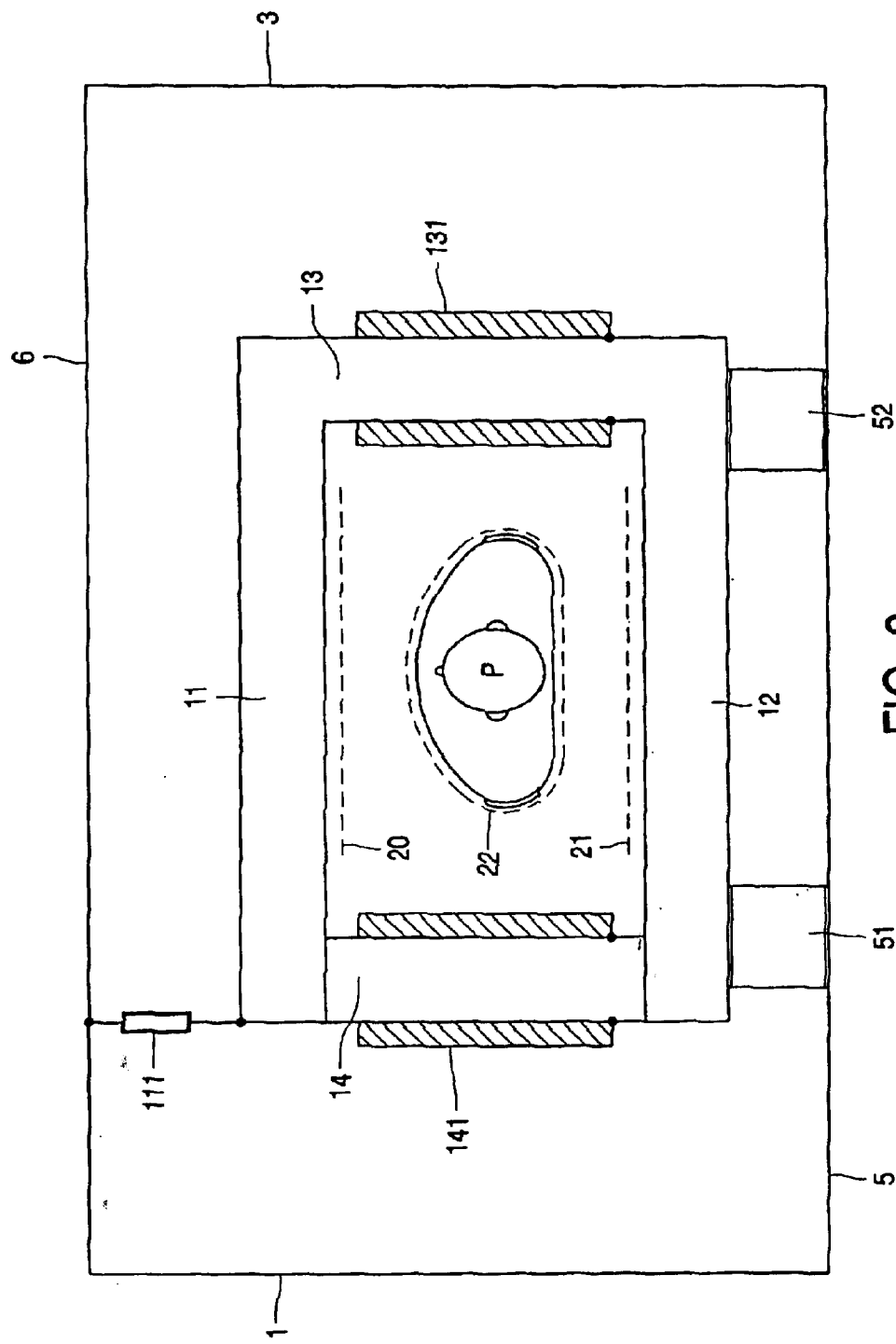
FIG. 3 is a side elevation of a second embodiment of the magnet system.

FIG. 3 shows a second embodiment of the invention in which the ends of the upper section 11 and of the lower section 12 of the magnet system which are free in the FIGS. 1 and 2 are supported by a second column 14. Because the accessibility of the patient P is hardly affected when such a step is taken, this system and other systems with three or four columns are still referred to as open systems.

The second column 14 is also enclosed by an impedance trap 141 (shown in a cut-away view) which has a length of $\lambda/4$; one end of said trap is short-circuited to the magnet structure whereas its other end is open, resulting once more in a $\lambda/4$ lead which constitutes a high-ohmic barrier for RF currents and hence suppresses electrical resonances of the magnet system at the wavelength $\lambda$ (MR frequency). Moreover, parts which correspond to those in FIG. 2 are again denoted by the same reference numerals, so that it is not necessary to repeat the foregoing description.

Figure 4:
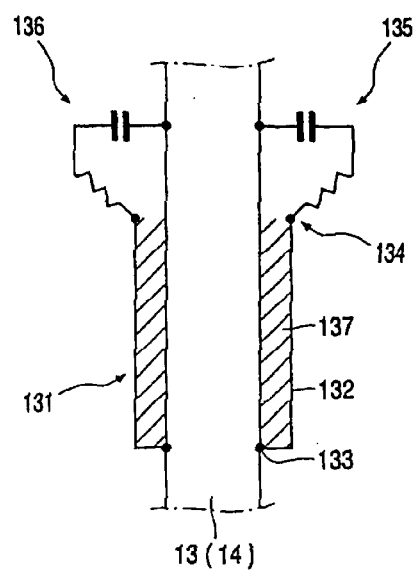
FIG. 4 is a representation at an increased scale of a part of the magnet system.

FIG. 4 is a detailed representation of a part of the column 13 (14) with the impedance trap 131 (141) in a cross-sectional view. The impedance trap is formed by an essentially sleeve-like, electrically conductive shield 132 (sleeve) which encloses the column 13 in a coaxial fashion, so that an intermediate space of a width of from approximately 1 to 2 cm exists between the column and the shield. The lower end 133 of the shield is electrically connected to the magnet structure of the column. The upper end 134 of the shield 132 is free or is coupled to the magnet structure via a plurality of preferably adjustable capacitors 135, 136. Furthermore, a dielectric 137 (for example, a ceramic material) is provided in the intermediate space between the shield 132 and the column 13. The dielectric as well as the capacitors serve to adjust the effective electrical length of the impedance trap in such a manner that there is formed a $\lambda/4$ lead which is tuned to the MR frequency. Suppression of resonances in the range of the MR frequency with approximately from 10 to 30 dB can thus be achieved, and hence also a corresponding decoupling between the magnet system 10 and the RF conductor structure 20, 21, 22.

The shield 132 encloses the column 13 in a coaxial fashion, like a sleeve, and has essentially the same cross-sectional shape as said column. The shield and the column can thus have a circular, rectangular or other cross-section.

Figure 5:
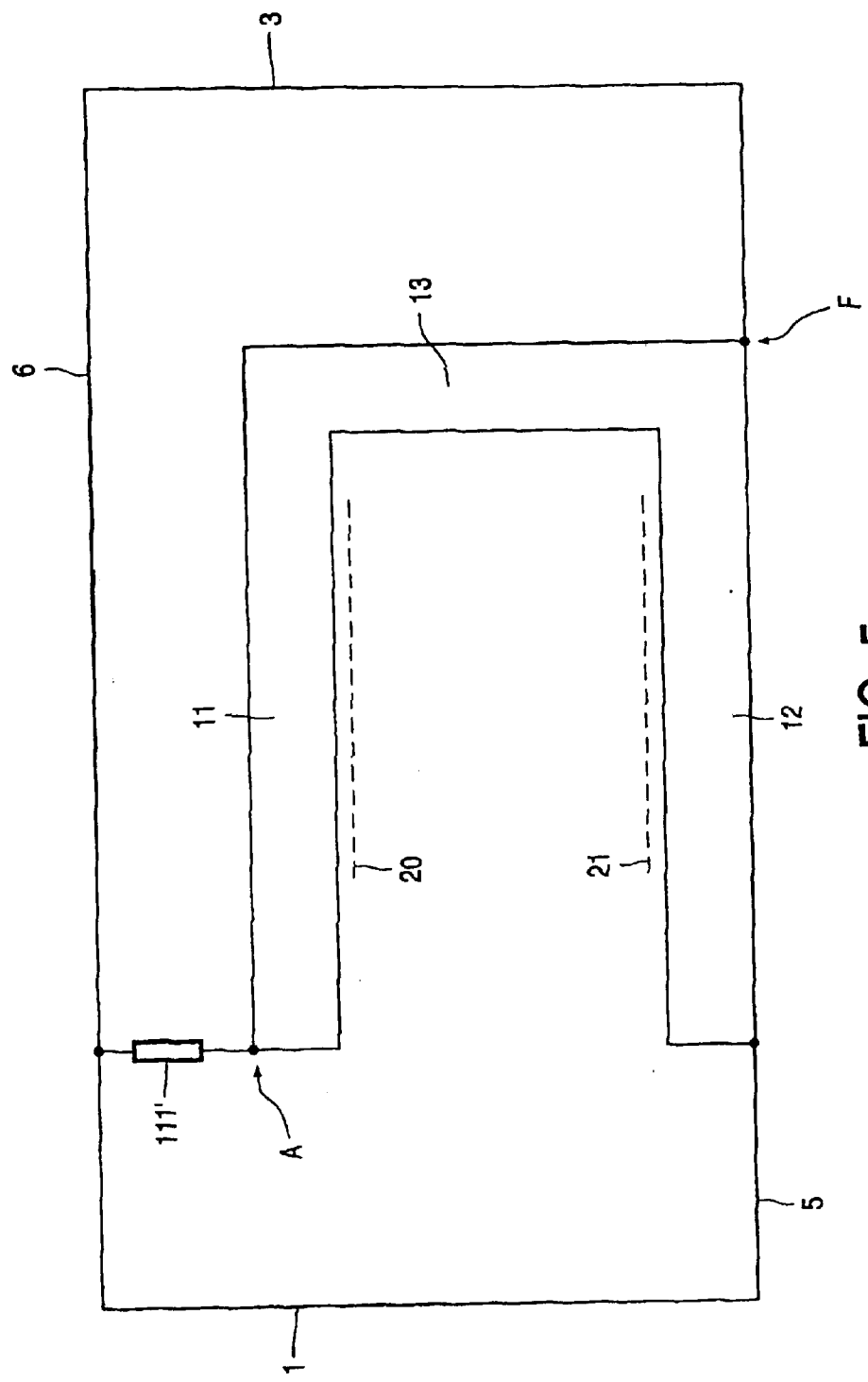
FIG. 5 is a side elevation of a third embodiment of the magnet system.

FIG. 5 shows a third embodiment in accordance with the invention in which the lower section 12 of the magnet system is electrically connected to the shielding provided in the floor 5 of the room. In this case the building up of so-called ground plane resonances must be prevented, because one end of the dipole is connected to ground potential. For this purpose the magnet system 10 is proportioned in such a manner that between the base point F of the column 13 and the point A of the coupling of an impedance 111' to the upper section 11 there is formed a conductor length of $n*\lambda/4$. This conductor length ensures, in co-operation with the capacitive impedance 111' which is connected in series and connected to the shield in the ceiling 6, a shift of the resonant frequency of the dipole out of the range of the MR frequency, so that coupling effects between the RF conductor structures and the magnet system are at least reduced. For the purpose of tuning the capacitive impedance 111' is preferably adjustable again. If necessary, it is also possible to dispense with the impedance and to couple the point A directly to the shielding in the ceiling 6 (short-circuit connection).

Should this configuration not be suitable to achieve adequate decoupling, the steps described with reference to the FIGS. 2 to 4 can be combined.

Finally, a further possibility for shifting the dipole self-resonance of the magnet system consists in connecting the upper section 11 and the lower section 12 to one another via a preferably adjustable capacitance (not shown). This is advantageous notably for the second embodiment which is shown in FIG. 3 when this capacitance is included in the second column 14 and the magnet system is present in the upper section 11 and the lower section 12 as well as in the first column 13.

This step can also be combined with one or more of the steps described with reference to the FIGS. 2 to 4.

Figure 6A:
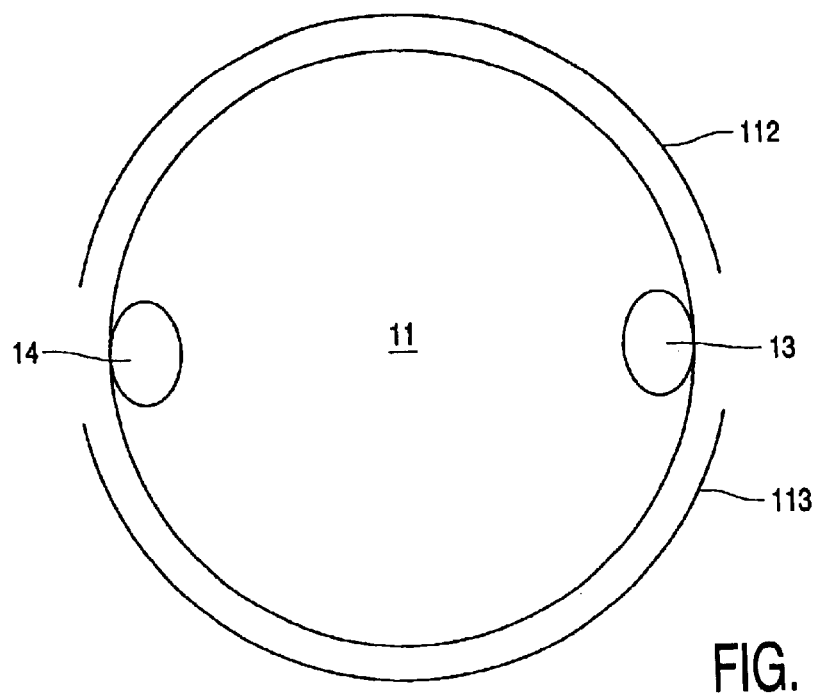
FIG. 6 is a diagrammatic plan view of a fourth embodiment of the magnet system.

FIG. 6(a) is a diagrammatic plan view of a fourth embodiment of the invention. This Figure shows the upper section 11 as well as the first column 13 and the second column 14 of the magnet system. The upper section 11 is provided with a first conductor loop 112 and a second conductor loop 113 which enclose the section each time like a semi-circle along its circumference and are inductively coupled to the part of the magnet system which is present in the upper section. Similarly, a third conductor loop and a fourth conductor loop (not shown) are arranged in a semi-circle around the lower section 12 so as to be inductively coupled to the part of the magnet system which is present therein.

Figure 6B:
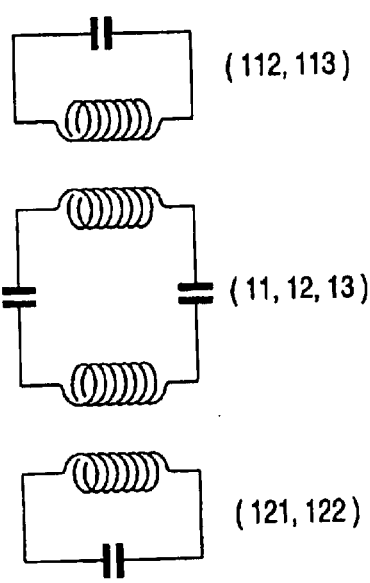

The electrical equivalent diagram of this configuration is shown in FIG. 6(b) in which the associated components are denoted by their reference numerals. The first conductor loop 112 and the second conductor loop 113 form a first resonant circuit whereas the third conductor loop 121 and the fourth conductor loop 122 of the lower section 12 form a second resonant circuit. The magnet system with the upper section 11 and the lower section 12 and the column 13, constituting a third resonant circuit, is situated between said two resonant circuits. The three resonant circuits are inductively coupled to one another.

The operation of this configuration is based on the fact that the coupling shifts the resonant frequency of the overall system, formed by the three resonant circuits, relative to the resonant frequency of the dipole structure, formed by the magnet system, in such a manner that an adequate distance from the MR frequency is obtained and hence coupling between the RF conductor structures and the magnet system is avoided. A coupling by way of capacitive elements could also be realized as an alternative for the inductive conductor loops.

If necessary, this embodiment can again be supplemented with individual or several of the features described in relation to the FIGS. 2 to 4 or 5.

In addition to avoiding a coupling between the RF conductor structures and the magnet system, it must also be ensured that no standing waves are excited in the room in which the MR imaging apparatus is installed and which is constructed as an RF cage for the previously described reasons, because such waves could be coupled to the RF transmitter coil and hence give rise to interference. This is because a value of approximately 42 MHz, that is, a value in the range of MR frequency, is obtained for the typical room dimensions of approximately 5 by 5 by 3 meters, that is, when the basic magnetic field has a strength of approximately 1 Tesla.

In this respect a further problem is encountered in that the radiation in the RF cage can be influenced and varied by the other objects present in the cage, and also by the persons who are working therein.

Figure 7:
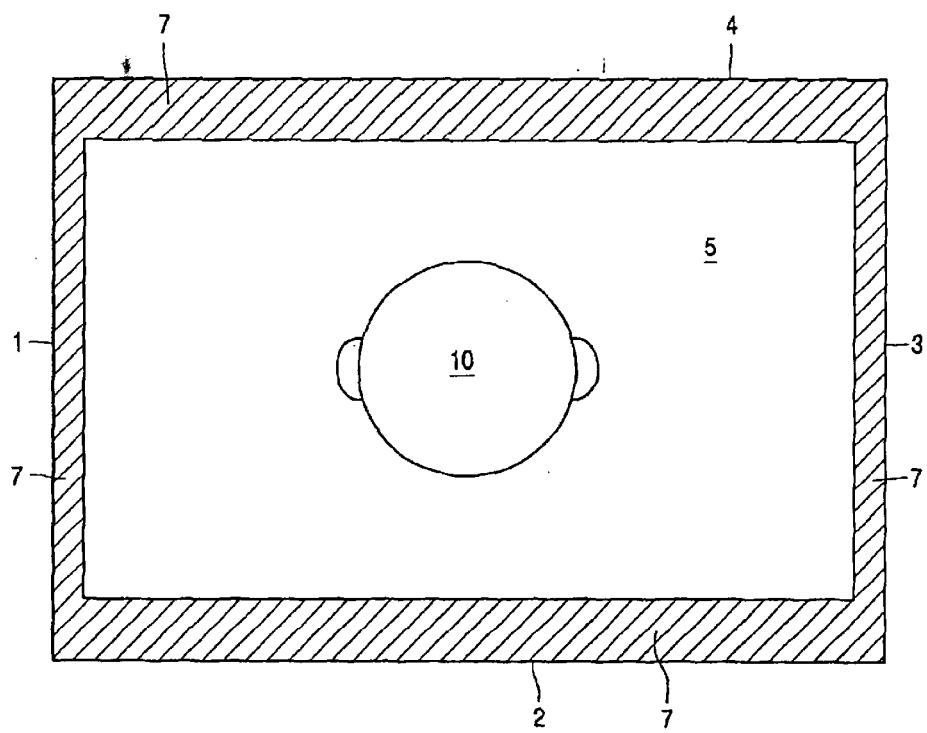
FIG. 7 is a diagrammatic plan view of an examination room with an MR imaging apparatus.

In order to avoid such problems, the magnet system 10, or the overall MR imaging apparatus, operates in an RF cage as shown in FIG. 7. FIG. 7 is a plan view of the RF cage with side walls 1 to 4, a floor 5 as well as a ceiling (not shown) which closes the cage at the top. All walls, the floor and the ceiling are provided on the inner side with a layer of RF absorber material 7. It has been found that foam impregnated with a carbon suspension is a suitable absorber material which essentially absorbs the radiated electromagnetic energy. Moreover, movable partitions (not shown) provided with such an absorber material can also be arranged in the RF cage; such partitions can be displaced at will within the cage. Using such an RF cage, which may have said room dimensions of 5 by 5 by 3 meters, standing waves can be avoided to a high degree.

What is claimed is:

1. A magnetic resonance imaging system for improved imaging quality, comprising:
   a magnetic resonance imaging apparatus (10) including:
   a first section (11, 12);
   a second section (11, 12);
   a vertical column section configured to interconnect the first section and the second section (13);
   wherein operation of the imaging apparatus (10) creates a magnetic resonance field having a magnetic resonance frequency; and
   wherein the sections (11, 12, 13) of the imaging apparatus are configured in a C-shape, whereby the imaging apparatus comprises a folded dipole having a self-resonant frequency;
   an RF cage (1 to 6) configured and oriented to enclose the imaging apparatus (10); and
   wherein the first section (11, 12) is electrically connected to the RF cage (1 to 6) via a capacitive impedance (111, 111') sufficiently to electrically extend the folded dipole in order to reduce the folded dipole's self-resonant frequency below the magnetic resonance frequency.

2. The imaging system of claim 1, wherein the self-resonant frequency of the folding dipole is modified by an impedance trap (131, 141) that encloses at least a part of the vertical column section (13).

3. The imaging system of claim 2, wherein the impedance trap (131, 141) comprises:

a sleeve-like shield (132) configured to coaxially enclose at least a part of the vertical column section (13), the shield comprising:
a first end electrically connected to the imaging apparatus (10);
a second end not electrically connected to the imaging apparatus (10);
wherein the impedance trap (131, 141) has an electrical length of $\lambda/4$, which is ¼ of the magnetic resonance wavelength $\lambda$.

4. The imaging system of claim 2, wherein the impedance trap (131, 141) comprises:
a sleeve-like shield (132) configured to coaxially enclose at least a part of the vertical column section (13), the shield comprising:
a first end electrically connected to the imaging apparatus (10);
a second end electrically connected to the imaging apparatus (10);
wherein the electrical connection of the second end to the imaging apparatus has greater capacitive impedance (135, 136) than the connection of the first end; and
wherein the capacitive impedance of the electrical connection of the second end to the imaging apparatus is tunable so that the effective electrical length of the impedance trap (131, 141) can be tuned to $\lambda/4$, which is ¼ of the magnetic resonance wavelength $\lambda$.

5. A magnetic resonance imaging system for improved imaging quality, comprising:
a magnetic resonance imaging apparatus (10) including:
a first section (11, 12);
a second section (11, 12);
a vertical column section configured to interconnect the first section and the second section (13);
wherein operation of the imaging apparatus (10) creates a magnetic resonance field having a magnetic resonance frequency; and
wherein the sections (11, 12, 13) of the imaging apparatus are configured in a C-shape, whereby the imaging apparatus comprises a folded dipole having a self-resonant frequency;
an RF cage (1 to 6) configured and oriented to enclose the imaging apparatus (10); and
wherein the first section (11, 12) is electrically connected to the RF cage (1 to 6) via a short-circuit (111, 111') sufficiently to electrically extend the folded dipole in order to reduce the folded dipole's self-resonant frequency below the magnetic resonance frequency.

6. The imaging system of claim 5, wherein the self-resonant frequency of the folding dipole is modified by an impedance trap (131, 141) that encloses at least apart of the vertical column section (13).

7. The imaging system of claim 6, wherein the impedance trap (131, 141)comprises:
a sleeve-like shield (132) configured to coaxially enclose at least a part of the vertical column section (13), the shield comprising:
a first end electrically connected to the imaging apparatus (10);
a second end not electrically connected to the imaging apparatus (10);
wherein the impedance trap (131, 141) has an electrical length of $\lambda/4$, which is ¼ of the magnetic resonance wavelength $\lambda$.

8. The imaging system of claim 6, wherein the impedance trap (131, 141) comprises:
a sleeve-like shield (132) configured to coaxially enclose at least a part of the vertical column section (13), the shield comprising:
a first end electrically connected to the imaging apparatus (10);
a second end electrically connected to the imaging apparatus (10);
wherein the electrical connection of the second end to the imaging apparatus has greater capacitive impedance (135, 136) than the connection of the first end; and
wherein the capacitive impedance of the electrical connection of the second end to the imaging apparatus is tunable so that the effective electrical length of the impedance trap (131, 141) can be tuned to $\lambda/4$, which is ¼ of the magnetic resonance wavelength $\lambda$.

9. A magnetic resonance imaging apparatus which is provided with an open magnet system, characterized in that coupling effects between a dipole structure (11, 12, 13), formed by the magnet system (10), and an RF conductor structure (20, 21, 22) which is tuned to an MR frequency are eliminated at least to a high degree by coupling the dipole structure to a surrounding RF cage via a capacitive impedance to shift or detune a resonance of the dipole structure relative to the MR frequency.

10. A magnetic resonance imaging apparatus as claimed in claim 9, characterized in that a first end of the dipole structure (11, 12, 13) is coupled, via a capacitive impedance (111, 111'), to a structure (5) that is connected to ground potential.

11. A magnetic resonance imaging apparatus as claimed in claim 10, characterized in that a second end of the dipole structure (11, 12, 13) is electrically connected to a structure (5) that is connected to ground potential, the length of the dipole structure between the capacitive impedance (111') and the ground structure amounting to $n*\lambda/4$, wherein $\lambda$ is the magnetic resonance.

12. A magnetic resonance imaging apparatus as claimed in claim 9, characterized in that the self-resonant frequency of the dipole structure (11, 12, 13) is detuned by capacitive and/or inductive elements provided on at least a part of the dipole structure.

13. A magnetic resonance imaging apparatus as claimed in claim 12, characterized in that the inductive elements are formed at least by one conductor loop (112, 113) that is inductively coupled to at least a part of the dipole structure.

14. A magnetic resonance imaging apparatus as claimed in claim 9, characterized in that the self-resonant frequency of the dipole structure is suppressed by an impedance trap (131, 141) that encloses at least a part (13) of the dipole structure (11, 12, 13).

15. A magnetic resonance imaging apparatus as claimed in claim 14, characterized in that the impedance trap (131) is formed by a sleeve-like shield (132) which encloses a part of the dipole structure (13) in a coaxial fashion and has an electrical length $\lambda/4$, which is ¼ of the magnetic resonance wavelength $\lambda$, a first axial end of the shield being electrically connected to the dipole structure whereas a second end is open.

16. A magnetic resonance imaging apparatus as claimed in claim 15, characterized in that a dielectric (137) is provided between the shield (132) and the dipole structure (13) in order to realize the electrical length of λ/4.

17. A magnetic resonance imaging apparatus as claimed in claim 15, characterized in that the open end of the shield (132) is coupled to the dipole structure (13) via at least one, preferably tunable capacitive impedance (135, 136) in order to achieve and/or tune the electrical length of λ/4.

18. A magnetic resonance imaging apparatus as claimed in claim 9, characterized in that the ground structure (5) forms part of the RF cage which encloses the magnet system (10) and whose walls (1 to 6) are covered with an RF absorber material (7).

* * * * *